(12) United States Patent
Kim et al.

(10) Patent No.: US 7,902,872 B2
(45) Date of Patent: Mar. 8, 2011

(54) DATA TRANSMITTERS AND METHODS THEREOF

(75) Inventors: Ki-Hong Kim, Hwaseong-si (KR); Soo-Won Kim, Seoul (KR); Gil-Su Kim, Seoul (KR); Woo-Kwan Lee, Seoul (KR); Woo-Jin Rim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 346 days.

(21) Appl. No.: 11/892,434

(22) Filed: Aug. 23, 2007

(65) Prior Publication Data

US 2008/0048720 A1 Feb. 28, 2008

(30) Foreign Application Priority Data

Aug. 23, 2006 (KR) .................. 10-2006-0079933

(51) Int. Cl.
*H03K 19/0175* (2006.01)

(52) U.S. Cl. ........................................ 326/82

(58) Field of Classification Search ............. 326/82–87, 326/26, 30
See application file for complete search history.

(56) References Cited

U.S. PATENT DOCUMENTS

| 6,288,581 | B1 | 9/2001 | Wong | |
|---|---|---|---|---|
| 7,126,378 | B2 * | 10/2006 | Stojanovic et al. | 326/87 |
| 2002/0061072 | A1 | 5/2002 | Pickering et al. | |
| 2002/0135404 | A1 * | 9/2002 | Payne et al. | 327/108 |
| 2004/0124888 | A1 | 7/2004 | Radelinow | |
| 2006/0255829 | A1 * | 11/2006 | Kim et al. | 326/30 |

FOREIGN PATENT DOCUMENTS

JP 2005-217999 8/2005

\* cited by examiner

*Primary Examiner* — Rexford N Barnie
*Assistant Examiner* — Thienvu V Tran
(74) *Attorney, Agent, or Firm* — Harness, Dickey & Pierce

(57) ABSTRACT

In a data transmitter, a main line driver circuit transmits an input signal to a receiver via a channel. A pre-emphasis circuit emphasizes a voltage level of the transmitted input signal, and a pre-emphasis controller controls the pre-emphasis circuit. The pre-emphasis controller adjusts a pre-emphasis level of the pre-emphasis circuit to increase an amount of current supplied to the channel at a transition time of the input signal in accordance with the transition condition of the channel.

6 Claims, 9 Drawing Sheets

DATA TRANSMITTERS AND METHODS THEREOF

PRIORITY STATEMENT

This U.S. non-provisional patent application claims priority under 35 U.S.C. §119 of Korean Patent Application No. 2006-79933 filed on Aug. 23, 2006, in the Korean Intellectual Property Office, the entire contents of which are hereby incorporated by reference.

BACKGROUND

With increasing data transmission speed, higher frequency band signals may be reduced along transmission lines. In some cases, swing ranges of higher frequency signals may decrease more than lower frequency signals. To compensate, a pre-emphasis technique in which a swing range of higher frequency signals may be set larger than a swing range of low frequency signals may be used.

In an open drain mode of a current-mode line driver used in conventional high speed transmitters, a relatively large amount of current may be needed to extend swing range. Therefore, a half-VDD line driver may be used to decrease current. The half-VDD line driver may reduce power consumption in half. Such a half-VDD line driver, however, may not achieve a desired bandwidth.

SUMMARY

Example embodiments relate to data transmission technology, for example, data transmitters and methods for adjusting a pre-emphasis level of a line driver used in transmitting data.

Example embodiments are directed to data transmitters operable in a required bandwidth range. Example embodiments are also directed to data transmitters capable of compensating for reduction of high frequency components in data transmission.

An example embodiment provides a data transmitter. According to at least this example embodiment, a main line driver circuit may transmit an input signal to a receiver via a channel. A pre-emphasis circuit may emphasize, boost or raise a voltage level of the transmitted input signal. A pre-emphasis controller may control the pre-emphasis circuit. The pre-emphasis controller inputs a transmission condition of the channel and adjusts a pre-emphasis level of the pre-emphasis circuit to increase an amount of current supplied into the channel at a transition time of the input signal in accordance with the transition condition of the channel.

At least one other example embodiment provides a data transmitter. In at least this example embodiment, a main line driver circuit may transmit an input signal to a receiver via a channel. A pre-emphasis circuit may adjust a characteristic of the transmitted input signal. A pre-emphasis controller may determine a transmission condition of the channel, and control the pre-emphasis circuit to adjust the characteristic of the pre-emphasis circuit to increase an amount of current supplied to the channel at a transition time of the input signal based on the determined transmission condition of the channel.

According to at least some example embodiments, the pre-emphasis circuit may pre-emphasize, boost or increase the input signal to compensate for reduction of high frequency components of the input signal during transmission of the input signal. In at least one example embodiment, the pre-emphasis circuit may boost, increase or raise the value of a signal characteristic to compensate for reduction of high frequency components of the input signal. The pre-emphasis circuit may increase a bandwidth of the input signal during transmission of the input signal. The pre-emphasis circuit may increase a voltage swing range of the input signal during transmission of the input signal. The pre-emphasis circuit may increase a slew rate of the input signal during transmission of the input signal.

According to at least some example embodiments, the pre-emphasis controller may generate a control signal informing of the transmission condition of the channel and the pre-emphasis circuit may adjust the pre-emphasis level in response to the control signal. The pre-emphasis circuit may increase or decrease the pre-emphasis level based on the control signal. For example, the pre-emphasis circuit may increase the pre-emphasis level if the control signal indicates that the transmission condition of the channel is good. Alternatively, the pre-emphasis circuit may decrease the pre-emphasis level if the control signal indicates that the transmission condition of the channel is bad.

Another example embodiment provides a method of transceiving data by a data transmitter including a pre-emphasis circuit. According to at least this example embodiment, a test transmission may be performed, and a transmission condition of a channel may be determined based on the test transmission. A pre-emphasis level may be decreased if the transmission condition is good, or the pre-emphasis level may be increased until the transmission condition is good.

Another example embodiment provides a method in which a test transmission may be performed. A transmission condition of a channel may be determined based on the test transmission, and a characteristic of a transmitted signal may be adjusted to increase an amount of current supplied to the channel at a transition time of the transmitted signal based on the determined transmission condition of the channel.

BRIEF DESCRIPTION OF THE FIGURES

Example embodiments will be described with reference to the following figures, wherein like reference numerals refer to like parts throughout the various figures unless otherwise specified. In the figures.

DETAILED DESCRIPTION OF EXAMPLE EMBODIMENTS

Figure 1:
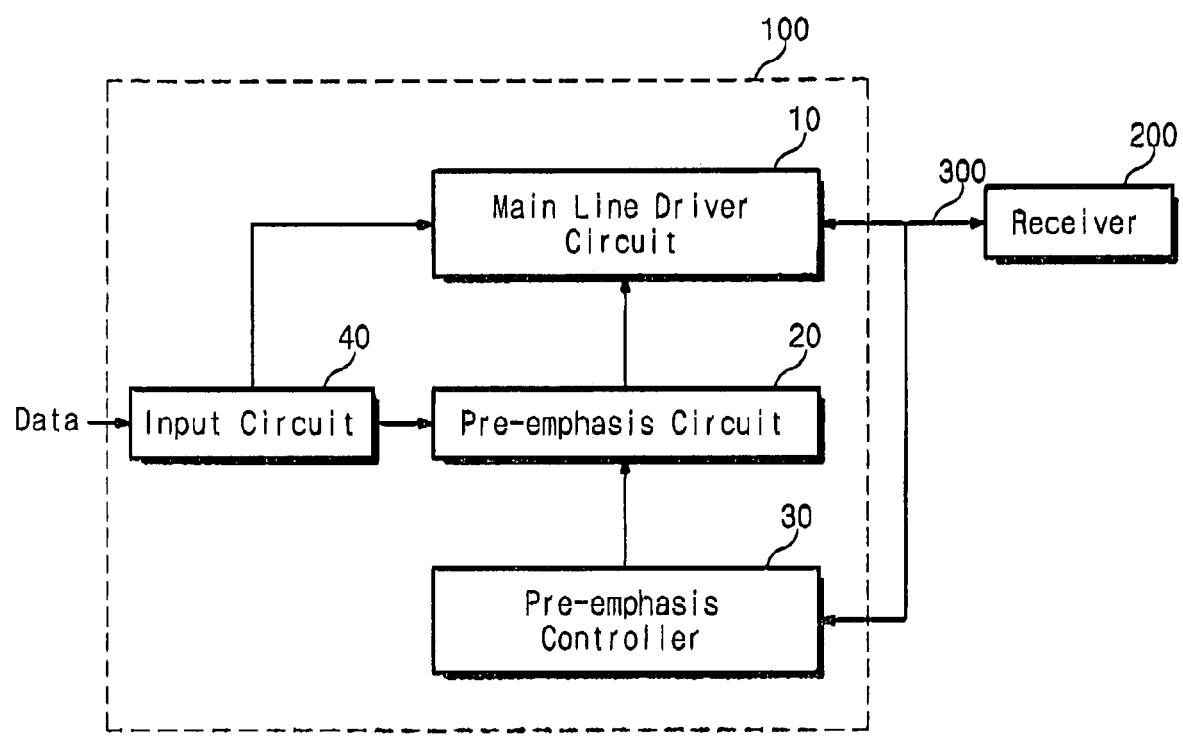
FIG. 1 is a block diagram of a data transceiving system according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a data transceiving system according to an example embodiment. Referring to FIG. 1, a data transmitter 100 may include a main line driver circuit 10, a pre-emphasis circuit 20, a pre-emphasis controller 30 and/or an input circuit 40.

The input circuit 40 may convert relatively low-speed parallel input signals into relatively high-speed serial input signals Vi and Vib. The high-speed serial input signals Vi and Vib may be transferred to the main line driver circuit 10. The input circuit 40 may also generate input signals Evi and Evib of the pre-emphasis circuit 20. The main line driver circuit 10 may transfer the high-speed serial input signals Vi and Vib to a receiver 200.

As a data transmission rate increases on a transmission line 300, a data signal may be reduced in a high frequency band. To compensate, the pre-emphasis circuit 20 may adjust signal characteristics of the data signal in the high frequency band. For example, the pre-emphasis circuit 20 may increase an amount of current of the data signal in the high frequency band, thereby raising a slew rate in the high frequency band to satisfy desired bandwidth conditions.

According to at least one example embodiment, the pre-emphasis controller 30 may determine a condition of the transmission line (or channel) 300 by way of a test transmission and adjust a pre-emphasis level of the pre-emphasis circuit 20 accordingly.

Figure 2:
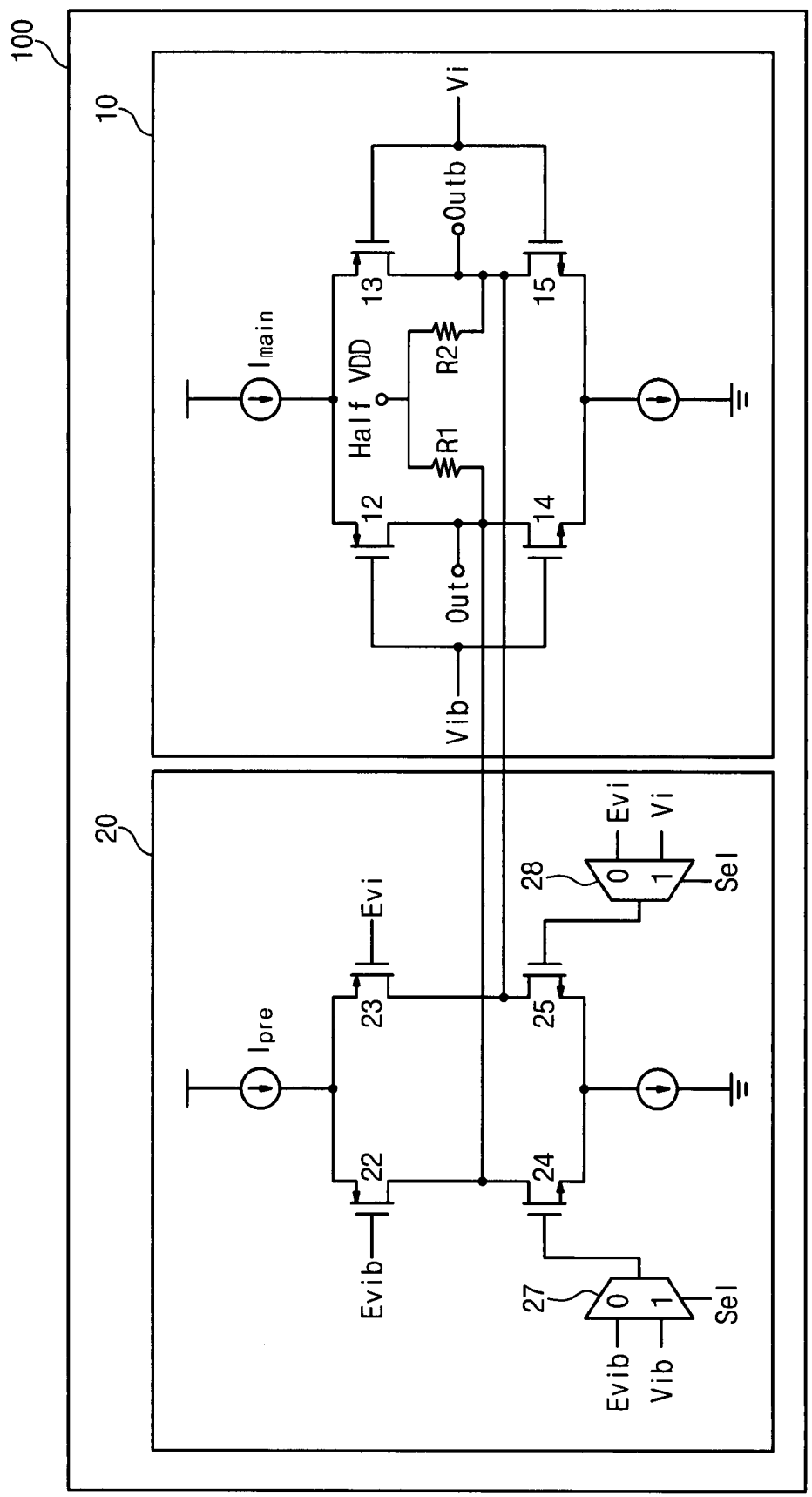
FIG. 2 is a circuit diagram of the data transmitter shown in FIG. 1.

FIG. 2 is a circuit diagram of the data transmitter 100 shown in FIG. 1. According to FIG. 2, the data transmitter 100 may include the main line driver circuit 10 and the pre-emphasis circuit 20.

The main line driver circuit 10 may be operable in a smaller current range by connecting NMOS transistors to PMOS transistors and fixing a swinging center node to a voltage half-VDD. However, the data transmitter 100 may operate at a relatively low switching rate, which may not be sufficient for a required bandwidth. As such, the pre-emphasis circuit 20 may be associated with the main line driver circuit 10.

The main line driver circuit 10 may utilize the input signals Vi and Vib, output signals Out and Outb, a power source current $I_{main}$, and may include a plurality of transistors. For example, the main line driver circuit 10 may include two NMOS transistors 14 and 15 and two PMOS transistors 12 and 13. Although example embodiments are discussed herein with regard to a specific arrangement of NMOS and PMOS transistors, such an explanation is for example purposes, and example embodiments should not be limited thereto.

Drains of the PMOS transistors 12 and 13 may be connected to drains of the NMOS transistors 14 and 15. Gates of the PMOS and NMOS transistors 12~15 may be coupled to the input signals Vi and Vib. Sources of the PMOS transistors 12 and 13 may receive the power source current $I_{main}$. The drains of the PMOS transistors 12 and 13 may be connected to the output signals Out and Outb and resistors R1 and R2 linking with a half power source voltage (half-VDD).

According to at least one example embodiment, the pre-emphasis circuit 20 may raise a slew rate by summing a current of the main line driver circuit 10 and a current from the pre-emphasis circuit 20 when there is a data transition. As a result, the data transmitter 100 may be operable in the required bandwidth and may be able to compensate for reduction of higher frequency components of data in channel transmission.

The pre-emphasis circuit 20 may utilize the input signals Vi, Vib, Evi, and Evib, the output signals Out and Outb, a power source current $I_{pre}$, and may include a plurality of transistors. For example, the pre-emphasis circuit 20 may include two NMOS transistors 24 and 25, two PMOS transistors 22 and 23, and two multiplexers 27 and 28. Although example embodiments are discussed herein with regard to a specific arrangement of NMOS and PMOS transistors, such an explanation is for example purposes, and example embodiments should not be limited thereto.

Drains of the PMOS transistors 22 and 23 may be connected to drains of the NMOS transistors 24 and 25. Gates of the PMOS transistors 22 and 23 may be coupled to the input signals Evi and Evib. Gates of the NMOS transistors 24 and 25 may be coupled to outputs of the multiplexers 27 and 28. The multiplexers 27 and 28 receive the input signals Evi and Vi and a control signal Sel. The power source current $I_{pre}$ may flow into the sources of the PMOS transistors 22 and 23. The output signals Out and Outb may be generated from the drains of the PMOS transistors 22 and 23.

Figure 3:
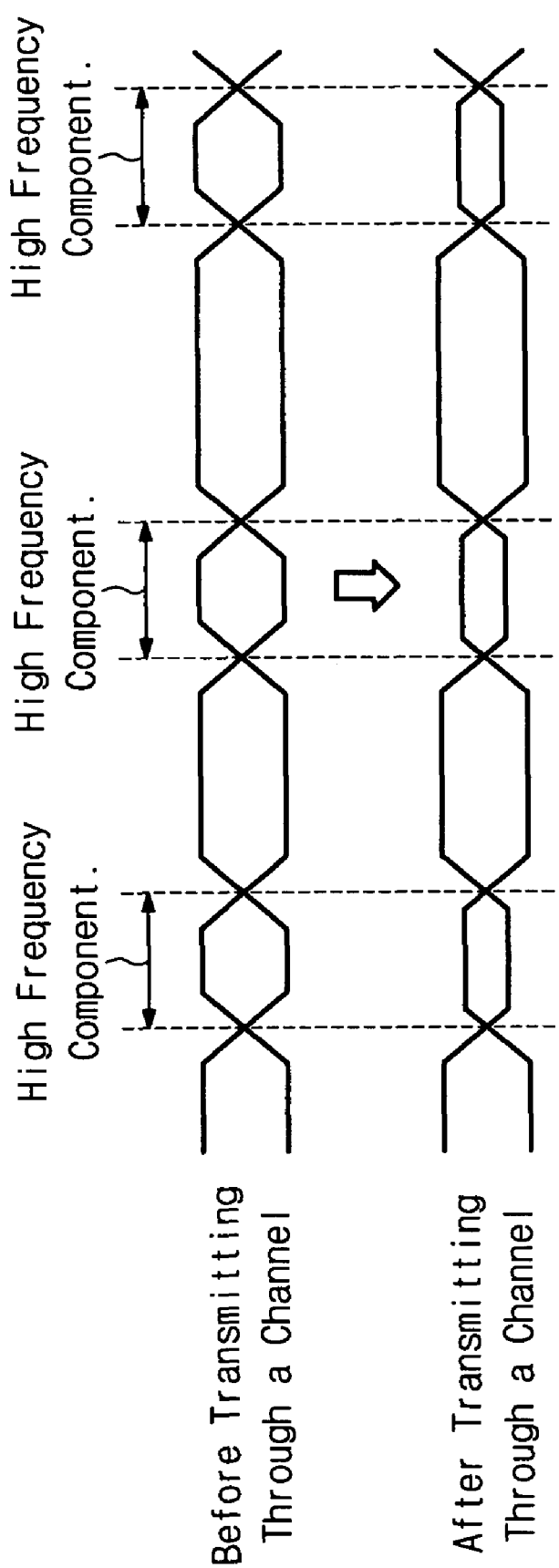
FIG. 3 is a timing diagram showing an example pattern of data transmission through a main line driver according to an example embodiment.

FIG. 3 is a timing diagram showing an example pattern of data transmission through only the main line driver according to an example embodiment. Referring to FIG. 3, if a high frequency component of data is transmitted through a channel, an output voltage of the high frequency component may decrease due to parasitic capacitance existing on the channel. Satisfying a required or desired bandwidth may be more difficult due to an output voltage drop of the high frequency component of data. Thus, the line driver may use a pre-emphasis circuit to compensate reduction to high frequency component of data.

Figure 4:
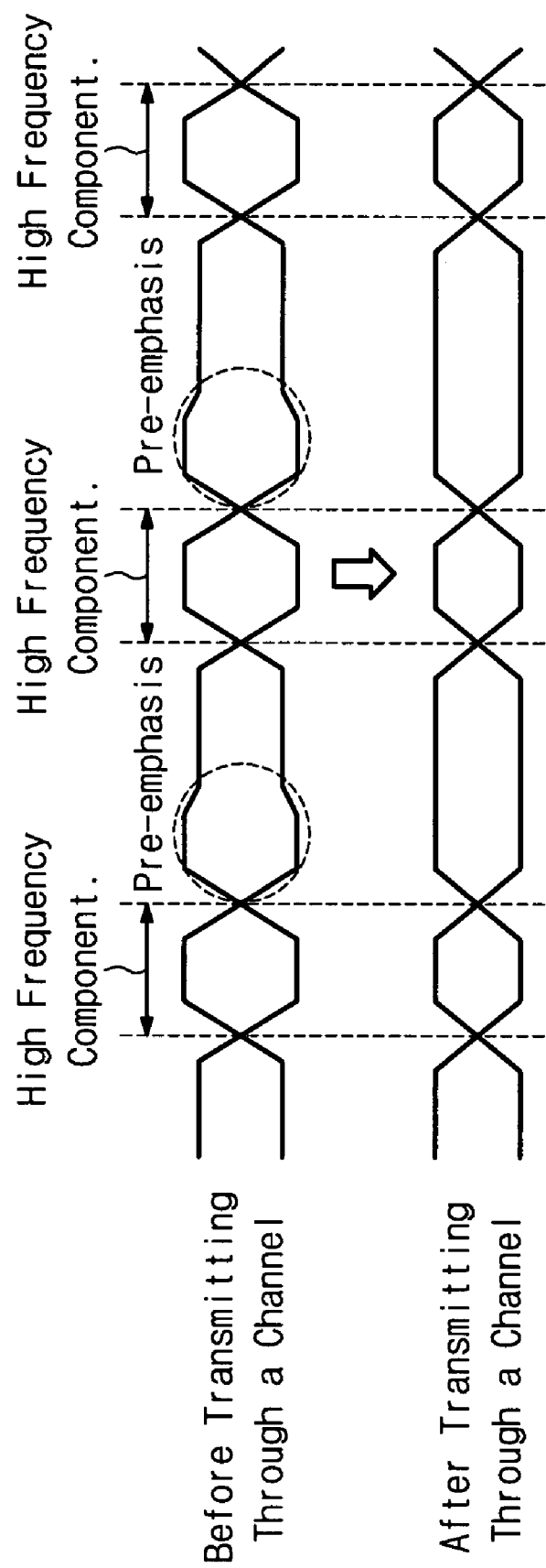
FIG. 4 is a timing diagram showing an example pattern of applying a pre-emphasis device for output voltage of data from the main line driver according to an example embodiment.

FIG. 4 is a timing diagram showing an example pattern in which a pre-emphasis device according to an example embodiment is applied. Referring to FIG. 4, an output voltage may be amplified by establishing the next stage pre-emphasis with high frequency components. Transmitting data with amplified, high frequency components of the data may be reduced less than in the conventional art without a pre-emphasis circuit.

A reduction rate of high frequency components in transmitted data may depend on a transmission condition of the channel. Better channel conditions may result in less loss, while worse channel conditions result in more loss. Thus, a pre-emphasis level may be adjusted in accordance with or based on channel conditions.

Figure 5:
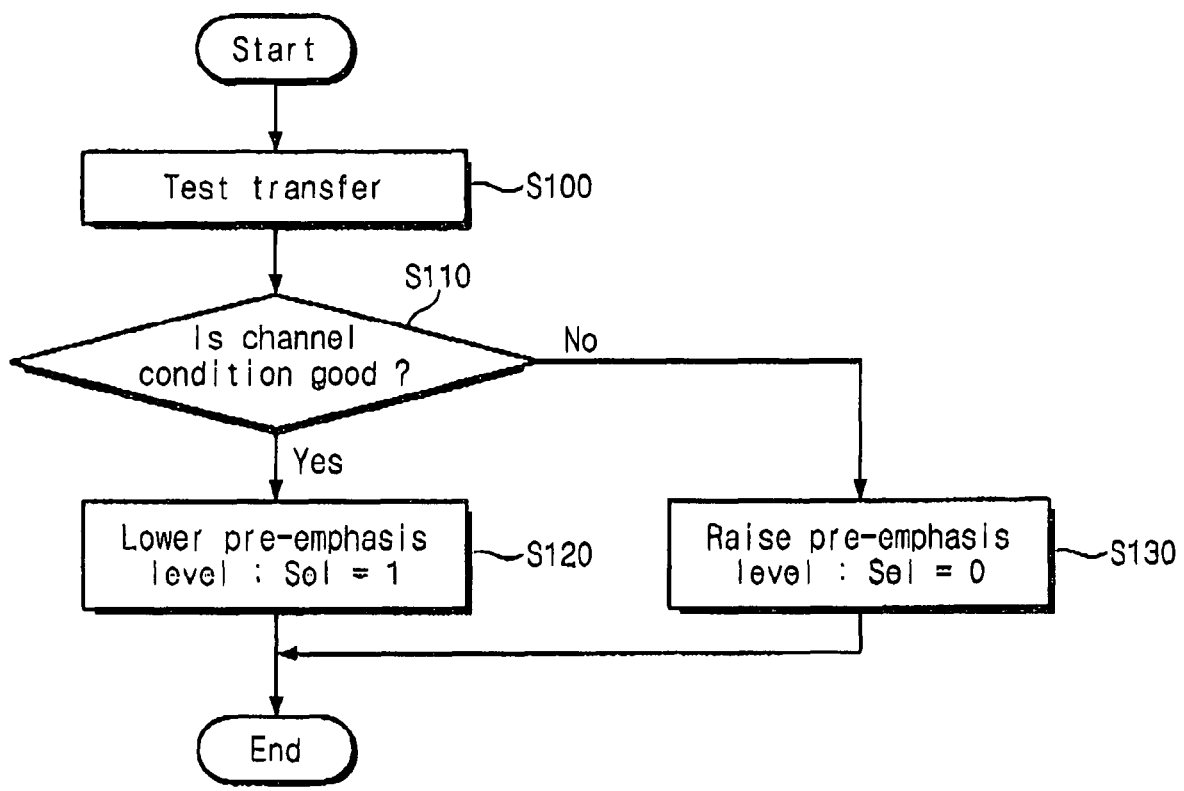
FIG. 5 is a flow chart illustrating a method for adjusting a pre-emphasis level in accordance with a channel condition according to an example embodiment.

FIG. 5 is a flow chart illustrating a method for adjusting a pre-emphasis level according to an example embodiment. According to FIGS. 1 and 5, at S100 the pre-emphasis controller 30 may conduct or perform a test transmission to determine a transmission condition of the channel 300. At S110, the pre-emphasis controller 30 may check or evaluate a transmission condition of the channel 300. If the channel condition is determined to be good (e.g., sufficient or acceptable for transmission), high frequency components of transmitted data may be reduced less. If the channel condition is bad (e.g., insufficient or unacceptable for transmission), high frequency components of transmitted data may be reduced more. The pre-emphasis controller 30 may adjust a pre-emphasis level by based on the determined transmission condition of the channel 300.

If the channel condition is good, the pre-emphasis level of the pre-emphasis circuit 20 is lowered at S120. If the channel condition is determined to be bad, the pre-emphasis level of the pre-emphasis circuit 20 is raised at S130.

Figure 6:
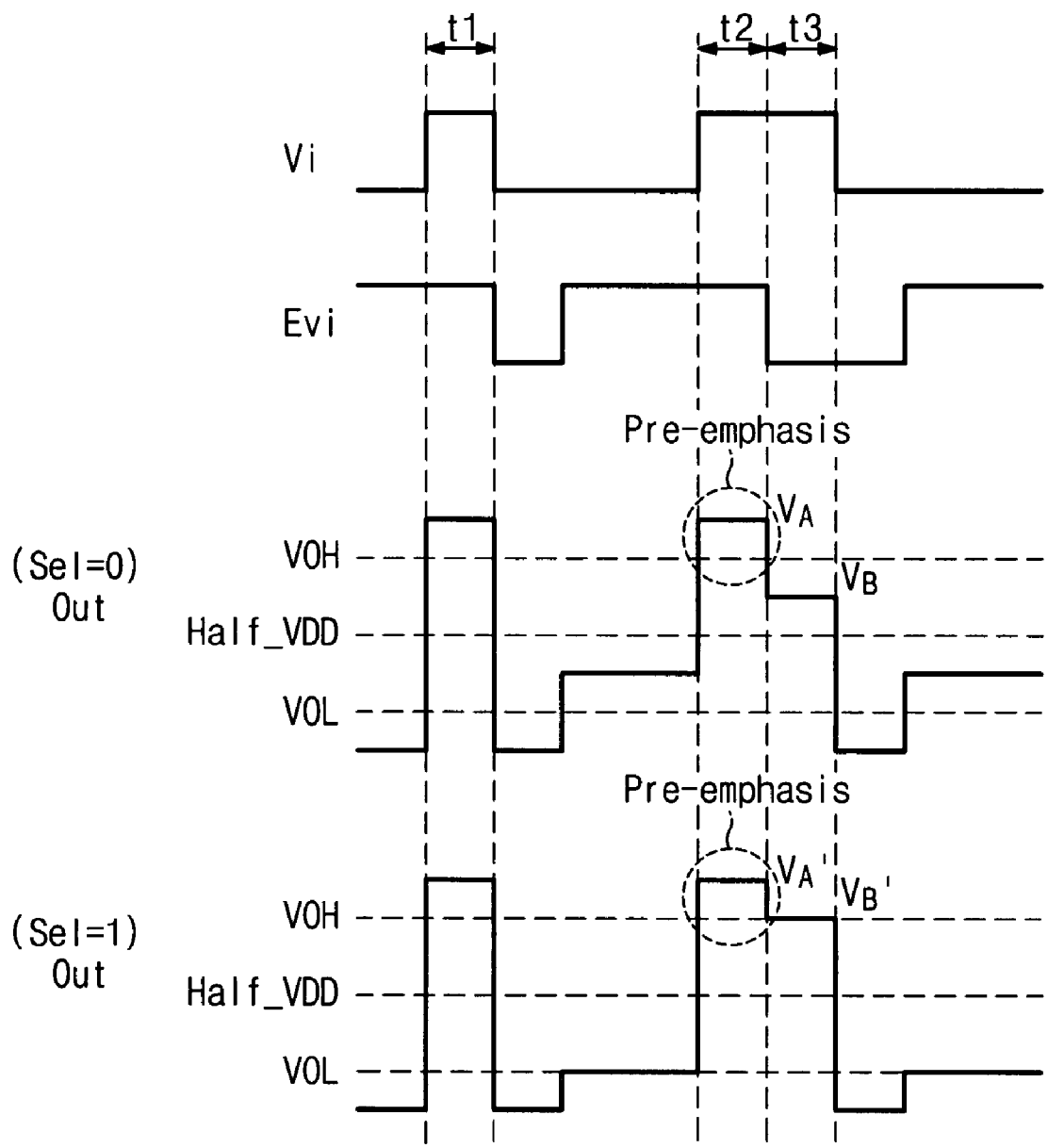
FIG. 6 is a timing diagram illustrating an output signal, and signals Vi and Evi shown in FIG. 2.

FIG. 6 is a timing diagram illustrating the output signal, and the signals Vi and Evi shown in FIG. 2. Referring to FIGS. 2 and 6, Vi is the data input signal. The input signal Evi may be obtained by inverting a signal shifted from the signal Vi by a 1-cycle delay. In this example embodiment, 1-cycle refers to a time period in which a relatively short data transition in a data stream occurs.

If a data transition occurs, a resultant current equal or substantially equal to the current $I_{main}$ of the main line driver circuit 10 and a current $I_{pre}$ of the pre-emphasis circuit 20 may flow through the resistors R1 and R2. An increase of the current $I_{main}+I_{pre}$ flowing through the resistors R1 and R2 by way of the pre-emphasis circuit 20 may cause a slew rate to increase. An increase of slew rate may improve bandwidth.

The pre-emphasis circuit 20 may adjust a pre-emphasis level using the signal Sel. For example, if a transmission condition of the channel 300 is good, a pre-emphasis level may be lowered by setting signal Sel=1. If a transmission condition of the channel 300 is bad, a pre-emphasis level may be raised by setting the signal Sel=0.

An output voltage of the main line driver 10 when signal Sel=0 may be different than an output voltage of the main line driver 10 when signal Sel=1. This difference of pre-emphasis levels may be represented in Equations 1 and 2 as follows.

$$V_A = 2R*(I_{main}+I_{pre})$$

$$V_B = 2R*(I_{main}-I_{pre})$$

$$V_A - V_B = 2R*2I_{pre} \quad \text{[Equation 1]}$$

$$V_A' = 2R*(I_{main}+I_{pre})$$

$$V_B' = 2R*I_{main}$$

$$V_A' - V_B' = 2R*I_{pre} \quad \text{[Equation 2]}$$

The pre-emphasis level $V_A-V_B$ when signal Sel=0 may be about two times the pre-emphasis level $V_A'-V_B'$ when signal Sel=1. In at least some example embodiments, a pre-emphasis level may be adjusted to a half its original level based on the signal Sel.

Figure 7:
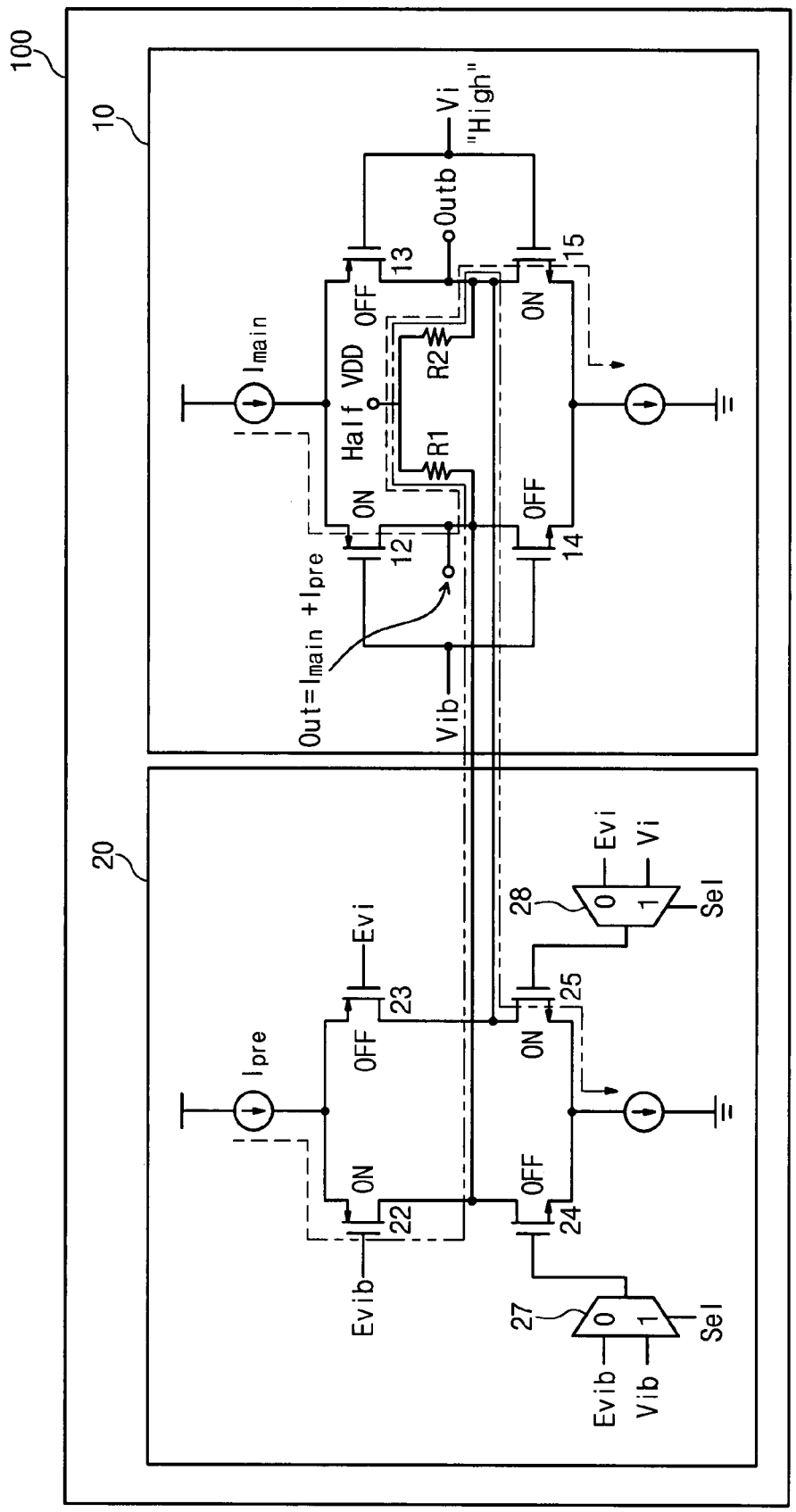
FIG. 7 is a circuit diagram illustrating an example operation of an example embodiment during periods t1 and t2 shown in FIG. 6.

FIG. 7 is a circuit diagram illustrating an example operation of an example embodiment during time periods t1 and t2 shown in FIG. 6. The period t1 is a high frequency period and the period t2 is a low frequency period. The pre-emphasis may increase a current of the next cycle after transitions of all data. A high frequency current may increase in the high frequency period, while a current of the former cycle may increase in the low frequency period.

Referring to FIGS. 1, 6 and 7, because the input signals Vi and Evi of the multiplexer of the pre-emphasis circuit 20 are the same or substantially the same, the control signal Sel of the pre-emphasis controller 30 may be generated to have the same or substantially the same value regardless of input value. During the periods t1 and t2, the power source currents $I_{main}$ and $I_{pre}$ of the main lone driver circuit 10 and the pre-emphasis circuit 20 may flow in the same direction. Thus, the output signal Out may be summed $I_{main}+I_{pre}$.

Figure 8:
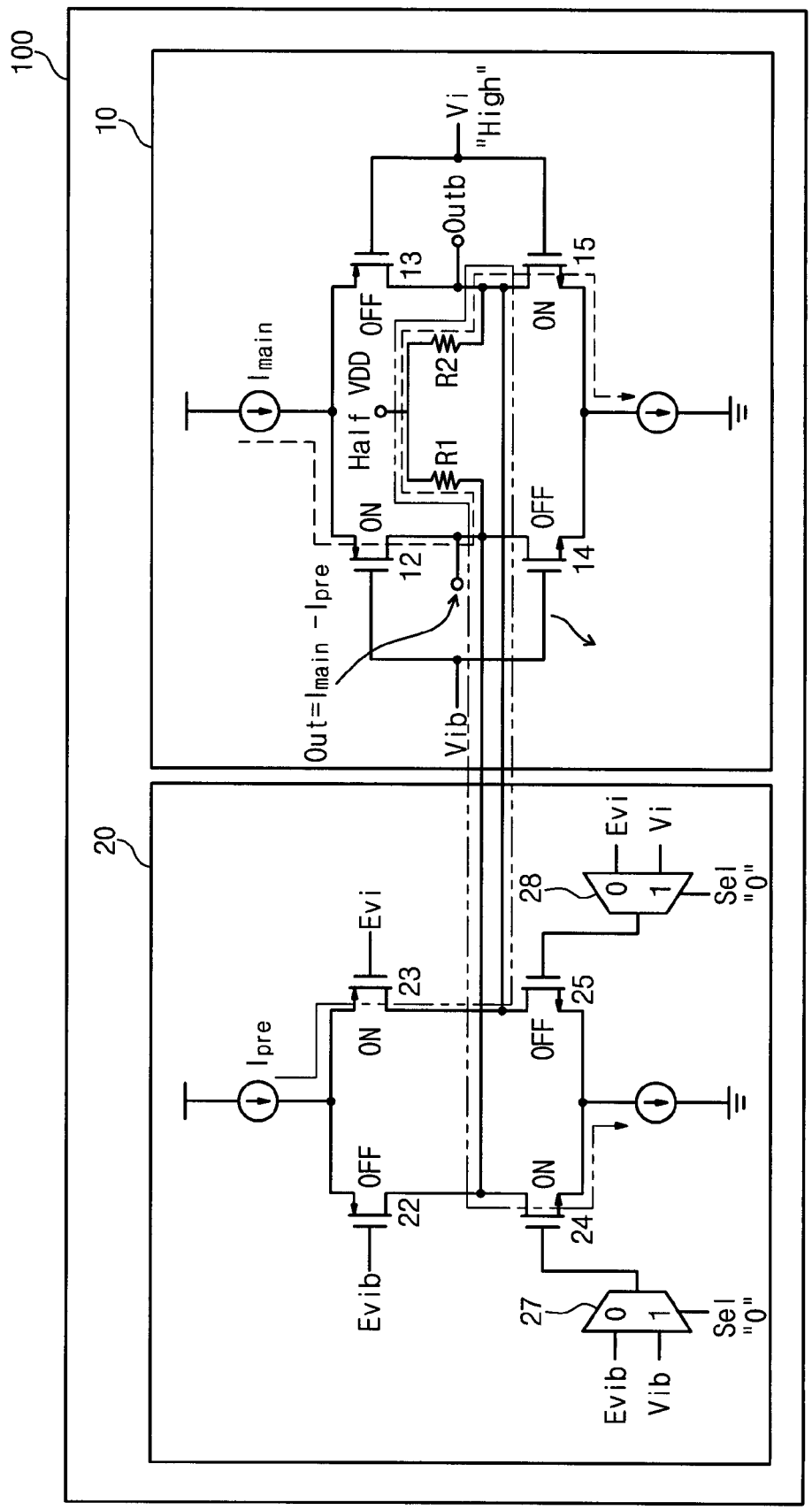
FIG. 8 is a circuit diagram illustrating an example operation of an example embodiment if Sel=0 for a time t3 shown in FIG. 6.

FIG. 8 is a circuit diagram illustrating an example operation if signal Sel=0 for a time t3 shown in FIG. 6. Referring to FIGS. 1, 6, and 8, when the control signal Sel of the pre-emphasis controller 30 is 0, the input signals Vi, Vib, Evi, and Evib may enable the PMOS and NMOS transistors 12, 23, 15, and 24 to turn on. During the time t3, for the output signal Out, the power source current $I_{main}$ of the main line driver circuit 10 may flow in a different direction than the power source current $I_{pre}$ of the pre-emphasis circuit 20. Thus, the output signal Out may be $I_{main}-I_{pre}$.

Figure 9:
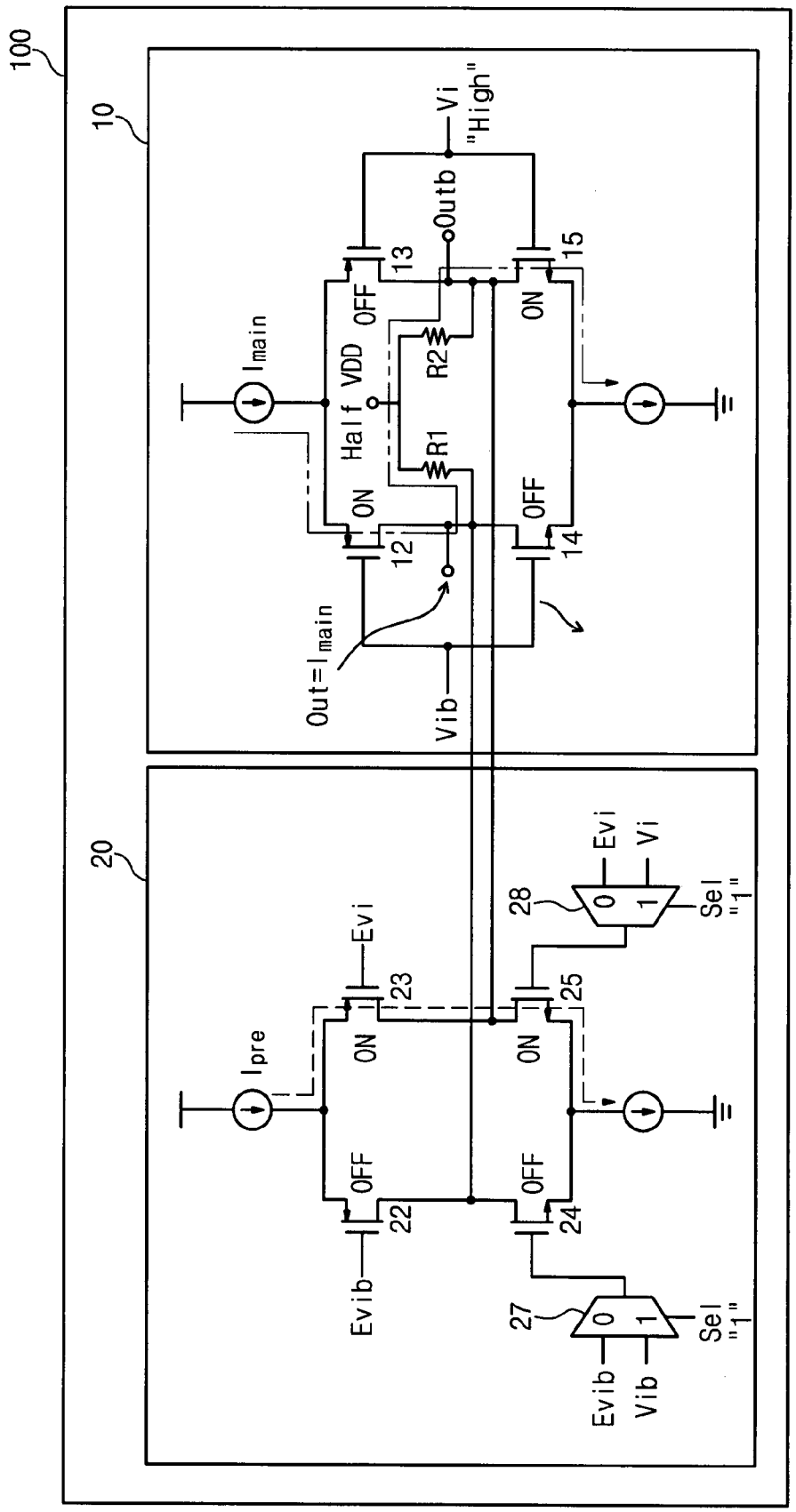
FIG. 9 is a circuit diagram illustrating an example operation of an example embodiment if Sel=1 for the time t3 shown in FIG. 6.

FIG. 9 is a circuit diagram illustrating an example operation if signal Sel=1 for the time t3 shown in FIG. 6. Referring to FIG. 9, when the control signal Sel of the pre-emphasis controller 30 is 1, the input signals Vi, Vib, Evi, and Evib may enable the PMOS and NMOS transistors 12, 23, 15, and 25 to turn on. During the time t3, for the output signal Out, the power source current $I_{main}$ of the main line driver circuit 10 may flow. Thus, the output signal Out may be $I_{main}$. Accordingly, the data transmitter 100 may control an amount of output current in accordance with the control signal Sel by the pre-emphasis controller 30.

Example embodiments may achieve a required bandwidth and/or voltage swing range by adding a pre-emphasis structure to a line driver including a half-VDD. Moreover, because reduction rate of high frequency components in transmitted data is dependent on a channel condition, a pre-emphasis level may be adjusted using a signal not a current.

Moreover, example embodiments may provide data transmitters operable in a required bandwidth and/or voltage swing range and/or capable of adjusting a pre-emphasis level.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   performing a test transmission;
   determining a transmission condition of a channel based on the test transmission; generating a control signal based on the determined condition of the transmission channel, the control signal being indicative of the transmission condition of the channel; and
   adjusting a characteristic of a transmitted signal based on the control signal to increase an amount of current supplied to the channel at a transition time of the transmitted signal based on the determined transmission condition of the channel; wherein the characteristic of the transmitted signal is adjusted to compensate for reduction of high frequency components of the transmitted signal during transmission of the transmitted signal, and the adjusting increases a bandwidth of the transmitted signal during transmission of the transmitted signal.

2. The method as set forth in claim 1, wherein the characteristic is a voltage level of the transmitted signal.

3. The method as set forth in claim 1, wherein the adjusting increases a voltage swing range of the transmitted signal during transmission of the transmitted signal.

4. The method as set forth in claim 1, wherein the adjusting increases a slew rate of the transmitted signal during transmission of the transmitted signal.

5. The method as set forth in claim 1, wherein a voltage level of the transmitted signal is decreased if the control signal indicates the transmission condition of the channel is acceptable.

6. The method as set forth in claim 1, wherein a voltage level of the transmitted signal is increased if the control signal indicates the transmission condition of the channel is not acceptable.

* * * * *